United States Patent
Schubert

(10) Patent No.: US 8,502,244 B2
(45) Date of Patent: Aug. 6, 2013

(54) SOLID STATE LIGHTING DEVICES WITH CURRENT ROUTING AND ASSOCIATED METHODS OF MANUFACTURING

(75) Inventor: Martin F. Schubert, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 57 days.

(21) Appl. No.: 12/872,219

(22) Filed: Aug. 31, 2010

(65) Prior Publication Data

US 2012/0049153 A1 Mar. 1, 2012

(51) Int. Cl.
- H01L 33/06 (2010.01)
- H01L 33/14 (2010.01)
- H01L 33/18 (2010.01)

(52) U.S. Cl.
USPC 257/94; 257/14; 257/E33.008; 257/E23.141; 438/26

(58) Field of Classification Search
None
See application file for complete search history.

(56) References Cited

U.S. PATENT DOCUMENTS

| | | | |
|---|---|---|---|
| 5,550,391 A | 8/1996 | Yamaguchi | |
| 6,621,106 B2 | 9/2003 | Murakami et al. | |
| 2007/0018184 A1* | 1/2007 | Beeson et al. | 257/98 |
| 2007/0145392 A1 | 6/2007 | Haberern et al. | |
| 2008/0017878 A1* | 1/2008 | Kuramoto | 257/99 |
| 2008/0217635 A1 | 9/2008 | Emerson et al. | |
| 2008/0230792 A1* | 9/2008 | Jiang et al. | 257/94 |
| 2008/0308829 A1 | 12/2008 | Liu et al. | |
| 2009/0039367 A1 | 2/2009 | Iso et al. | |
| 2009/0072257 A1* | 3/2009 | Unno et al. | 257/98 |
| 2009/0273003 A1 | 11/2009 | Park | |
| 2010/0025717 A1* | 2/2010 | Fujii et al. | 257/98 |
| 2010/0032704 A1* | 2/2010 | Denbaars et al. | 257/98 |
| 2010/0072487 A1 | 3/2010 | Tsai et al. | |
| 2010/0072501 A1* | 3/2010 | Wakai et al. | 257/98 |
| 2010/0171137 A1* | 7/2010 | Mochizuki | 257/98 |
| 2012/0007116 A1 | 1/2012 | Nakano et al. | |

FOREIGN PATENT DOCUMENTS

| | | | |
|---|---|---|---|
| JP | 2001274456 A | | 10/2001 |
| JP | 2011129922 A | * | 6/2011 |
| JP | 2011160006 A | * | 8/2011 |
| WO | 2007036164 A1 | | 4/2007 |
| WO | 2009134095 A2 | | 11/2009 |
| WO | 2010092783 A1 | | 8/2010 |

OTHER PUBLICATIONS

Song, J.O.; Jun-Seok Ha; Tae-Yeon Seong; , "Ohmic-Contact Technology for GaN-Based Light-Emitting Diodes: Role of P-Type Contact," Electron Devices, IEEE Transactions on , vol. 57, No. 1, pp. 42-59, Jan. 2010.*

(Continued)

*Primary Examiner* — Thomas L Dickey
*Assistant Examiner* — Joseph Schoenholtz
(74) *Attorney, Agent, or Firm* — Perkins Coie LLP

(57) ABSTRACT

Solid state lighting ("SSL") devices with improved contacts and associated methods of manufacturing are disclosed herein. In one embodiment, an SSL device includes a first semiconductor material, a second semiconductor material spaced apart from the first semiconductor material, and an active region between the first and second semiconductor materials. The SSL device also includes a first contact on the first semiconductor material and a second contact on the second semiconductor material. The second contact is opposite the first contact. The SSL device further includes an insulative material between the first contact and the first semiconductor material, the insulative material being generally aligned with the second contact.

16 Claims, 6 Drawing Sheets

OTHER PUBLICATIONS

Lin, M. E., Z. Ma, F. Y. Huang, Z. F. Fan, L. H. Allen, and H. Morkoç. "Low Resistance Ohmic Contacts on Wide Band-gap GaN." Applied Physics Letters 64.8 (1994): 1003.*

Jang, Ja-Soon, In-Sik Chang, Han-Ki Kim, Tae-Yeon Seong, Seonghoon Lee, and Seong-Ju Park. "Low-resistance Pt/Ni/Au Ohmic Contacts to P-type GaN." Applied Physics Letters 74.1 (1999): 70.*

International Search Report and Written Opinion mailed Apr. 9, 2012 in International Application No. PCT/US2011/047977, 8 pages.

* cited by examiner

SOLID STATE LIGHTING DEVICES WITH CURRENT ROUTING AND ASSOCIATED METHODS OF MANUFACTURING

TECHNICAL FIELD

The present disclosure is related to solid state lighting ("SSL") devices with current routing and associated methods of manufacturing.

BACKGROUND

Mobile phones, personal digital assistants ("PDAs"), digital cameras, MP3 players, and other portable electronic devices utilize SSL devices (e.g., light emitting diodes (LEDs)) for background illumination. SSL devices are also used for signage, indoor lighting, outdoor lighting, and other types of general illumination. FIGS. 1A and 1B are cross-sectional and plan views of a conventional SSL device 10, respectively. As shown in FIGS. 1A and 1B, the SSL device 10 includes an LED structure 11 having N-type gallium nitride (GaN) 14, GaN/indium gallium nitride (InGaN) multiple quantum wells ("MQWs") 16, and P-type GaN 18. The SSL device 10 also includes a first contact 20 proximate the N-type GaN 14 and a second contact 22 proximate the P-type GaN 18. The first contact 20 includes a plurality of contact fingers 21 (three are shown for illustration purposes) coupled to one another by a cross member 23. The second contact 22 includes a sheet-like structure.

In operation, a continuous or pulsed electrical voltage is applied between the first and second contacts 20 and 22. In response, an electrical current flows from the first contact 20, through the N-type GaN 14, the GaN/InGaN MQWs 16, and the P-type GaN 18, to the second contact 22. The GaN/InGaN MQWs 16 convert a portion of the electrical energy into light, and the light is extracted from the N-type GaN 14 of the SSL devices 10 for illumination, signage, and/or other suitable purposes.

The SSL device 10, however, may have low light extraction efficiencies. According to conventional techniques, the first and second contacts 20 and 22 typically include aluminum, copper, silver, and/or other non-transparent conductive materials. As a result, light generated in areas corresponding to the contact fingers 21 and cross member 23 can be difficult to extract. On the other hand, as discussed in more detail below, the areas of the GaN/InGaN MQWs 16 directly between the second contact 22 and the contact fingers 21 and cross member 23 of the first contact 20 produce the highest light intensity in the SSL device 10. As a result, a large portion of the light generated in the SSL device 10 may be blocked by the first contact 20. Accordingly, several improvements in increasing light extraction efficiency in SSL devices may be desirable.

DETAILED DESCRIPTION

Various embodiments of SSL devices with current routing and associated methods of manufacturing such SSL devices are described below. As used hereinafter, the term "SSL device" generally refers to devices with LEDs, organic light emitting diodes ("OLEDs"), laser diodes ("LDs"), polymer light emitting diodes ("PLEDs"), and/or other suitable sources of radiation other than electrical filaments, a plasma, or a gas. The term "light extraction efficiency" generally refers to a ratio of light extracted from an SSL device to total light generated in the SSL device. A person skilled in the relevant art will also understand that the technology may have additional embodiments, and that the technology may be practiced without several of the details of the embodiments described below with reference to FIGS. 2A-5E.

Figure 2A:
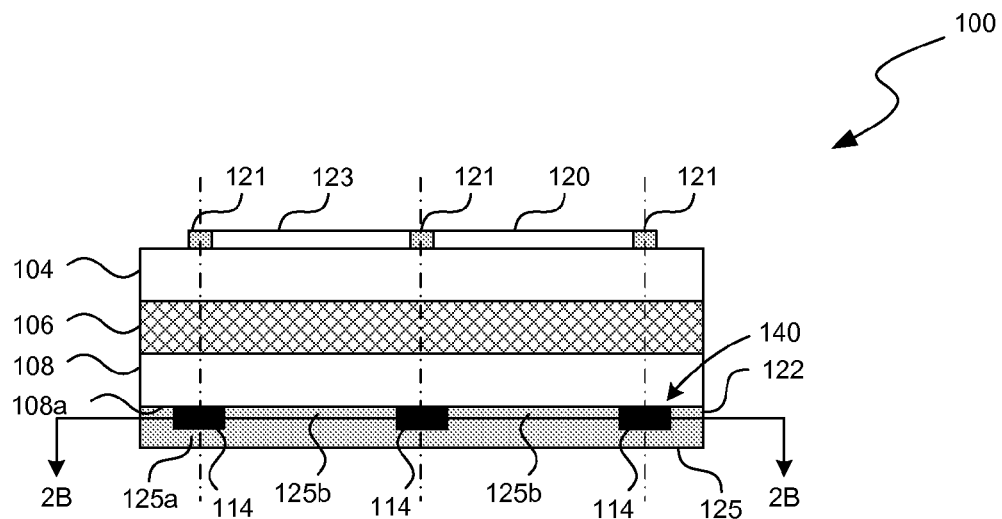
FIG. 2A is a schematic cross-sectional view of an SSL device with current routing in accordance with embodiments of the technology.
Figure 2B:
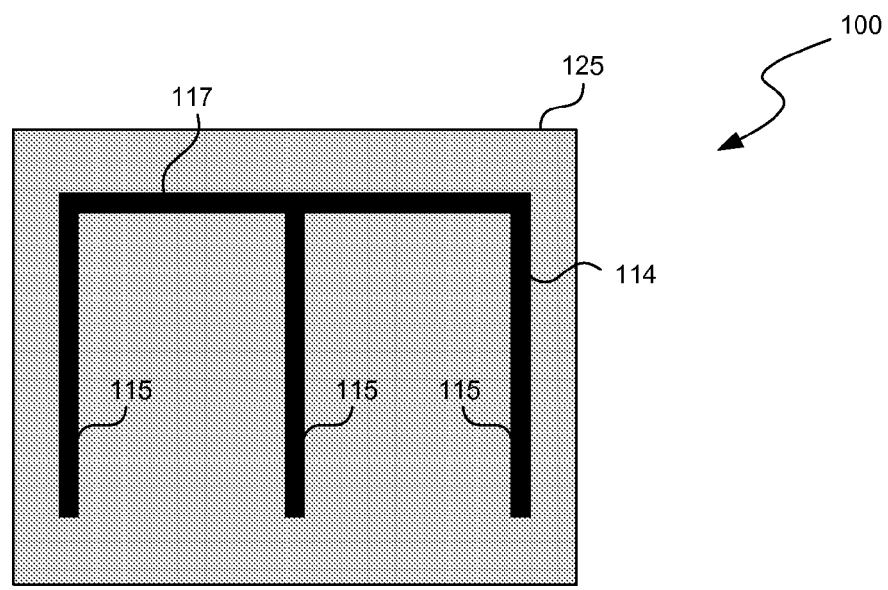
FIG. 2B is a schematic plan view of a portion of the SSL device in FIG. 2A.

FIG. 2A is a schematic cross-sectional view of an SSL device 100 in accordance with embodiments of the technology. FIG. 2B is a plan view of a portion of the SSL device 100. As shown in FIG. 2A, the SSL device 100 can include a first semiconductor material 104, an active region 106, and a second semiconductor material 108. The SSL device 100 can also include a first contact 120 proximate the first semiconductor material 104 and a second contact 122 proximate the second semiconductor material 108. In the illustrated embodiment, the first and second contacts 120 and 122 are arranged vertically relative to each other. In other embodiments, the first and second contacts 120 and 122 can have other suitable contact configurations. In any of these embodiments, the SSL device 100 can optionally include a reflective material (e.g., a silver film), a carrier material (e.g., a ceramic substrate), an optical component (e.g., a collimator), and/or other suitable components.

The first and second semiconductor materials 104 and 108 can be configured as cladding components for the active region 106. In certain embodiments, the first semiconductor material 104 can include N-type GaN (e.g., doped with silicon (Si)), and the second semiconductor material 108 can include P-type GaN (e.g., doped with magnesium (Mg)). In other embodiments, the first semiconductor material 104 can include P-type GaN, and the second semiconductor material 108 can include N-type GaN. In further embodiments, the first and second semiconductor materials 104 and 108 can individually include at least one of gallium arsenide (GaAs), aluminum gallium arsenide (AlGaAs), gallium arsenide phosphide (GaAsP), gallium (III) phosphide (GaP), zinc selenide (ZnSe), boron nitride (BN), aluminum gallium nitride (AlGaN), and/or other suitable semiconductor materials.

The active region 106 can include a single quantum well ("SQW"), MQWs, and/or a bulk semiconductor material. The term "bulk semiconductor material" generally refers to a single grain semiconductor material (e.g., InGaN) with a thickness greater than about 10 nanometers and up to about 500 nanometers. In certain embodiments, the active region 106 can include an InGaN SQW, GaN/InGaN MQWs, and/or an InGaN bulk material. In other embodiments, the active region 106 can include aluminum gallium indium phosphide (AlGaInP), aluminum gallium indium nitride (AlGaInN), and/or other suitable materials or configurations.

In certain embodiments, the first semiconductor material 104, the active region 106, and the second semiconductor material 108 can be formed via metal organic chemical vapor deposition ("MOCVD"), molecular beam epitaxy ("MBE"), liquid phase epitaxy ("LPE"), and/or hydride vapor phase epitaxy ("HVPE"). In other embodiments, at least one of the foregoing components may be formed via other suitable epitaxial growth techniques.

Figure 1A:
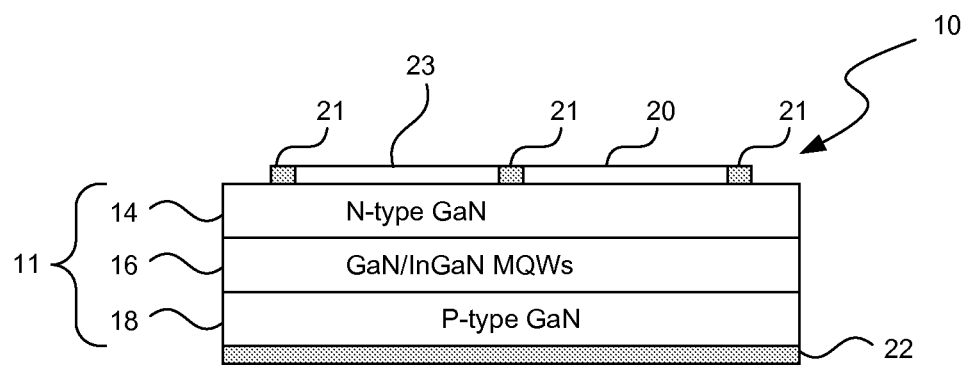
FIG. 1A is a schematic cross-sectional diagram of an SSL device in accordance with the prior art.
Figure 1B:
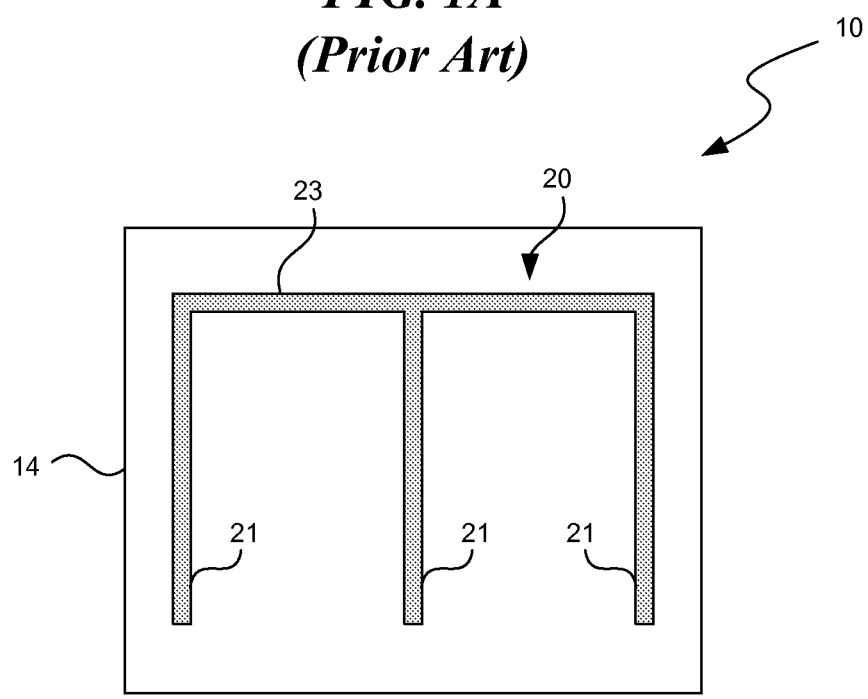
FIG. 1B is a schematic plan view of the SSL device in FIG. 1A.

The first contact 120 can have a structure generally similar to the first contact 20 shown in FIG. 1B. For example, the first contact 120 can include a plurality of contact fingers 121 connected to one another by a cross member 123. The contact fingers 121 and/or the cross member 123 can individually include an elongated structure and/or other suitable structures. The contact fingers 121 and the cross member 123 can be constructed from copper (Cu), aluminum (Al), silver (Ag), gold (Au), platinum (Pt), and/or other suitable metals or metal alloys. In other embodiments, the first contact 120 can be constructed from indium tin oxide ("ITO"), aluminum zinc oxide ("AZO"), fluorine-doped tin oxide ("FTO"), and/or other suitable transparent and conductive oxide.

The second contact 122 can include a current router (generally designated by the arrow 140) at least partially encapsulated by a conductive material 125. In the illustrated embodiment, the current router 140 includes a plurality of pads of an insulative material 114, which can include silicon dioxide ($SiO_2$), silicon nitride (SiN), and/or other dielectric materials. The insulative material 114 can be in direct contact with a surface 108a of the second semiconductor material 108. In other embodiments, the current router 140 can include a contact material and/or other suitable materials, as discussed in more detail below with reference to FIGS. 4A and 4B. In further embodiments, the current router 140 may include a combination of conductive, semiconductive, and insulative materials.

As shown in FIG. 2A, the conductive material 125 can be formed around the insulative material 114 of the current router 140. The conductive material 125 can include a generally continuous first portion 125a and a second portion 125b between adjacent pads of the insulative material 114. In general, the second portion 125b of the conductive material 125 is in direct contact with and electrically coupled to portions of the surface 108a of the second semiconductor material 108 that are not covered by the insulative material 114. In the illustrated embodiment, the first and second portions 125a and 125b are generally homogeneous and contain the same material (e.g., aluminum). In other embodiments, the first and second portions 125a and 125b may contain different materials. For example, the first portion 125a may contain aluminum, and the second portion 125b may contain silver, gold, copper, and/or other conductive materials other than aluminum.

The insulative material 114 of the current router 140 is generally aligned with corresponding contact fingers 121 and/or the cross member 123. As shown in FIG. 2B, the insulative material 114 can have a shape generally corresponding to the second contact 122. For example, the insulative material 114 can include a plurality of insulative fingers 115 (three are shown for illustration purposes) connected to one another by a cross member 117. In the illustrated embodiment shown in FIG. 2A, the insulative material 114 has a width larger than that of the corresponding contact fingers 121. In other embodiments, the insulative material 114 can have a width that is substantially similar to or smaller than that of the corresponding contact fingers 121. In any of the foregoing embodiments, the width of the insulative material 114 may be selected based on a target current flow profile in the SSL device 100.

Several embodiments of the SSL device 100 with the current router 140 can have higher light extraction efficiencies than conventional devices. Referring back to FIGS. 1A and 1B, without being bound by theory, it is believed that the areas corresponding to the contact fingers 21 and/or cross member 23 (hereinafter referred to as "contact areas") in the SSL device 10 tend to have the highest current density across the SSL device 100 because the contact areas form the shortest paths for the electrical current to flow through. Other areas (e.g., those outboard the contact fingers 21, hereinafter referred to as "non-contact areas") tend to have lower current densities. As a result, more light may be generated from contact areas than non-contact areas of the SSL device 10. However, the contact fingers 21 and the cross member 23 are typically made from a non-transparent material. Thus, the light generated from the contact areas may not be readily extracted, which reduces the light extraction efficiency. The embodiment shown in FIGS. 2A and 2B increases the contact resistance in the contact areas with the current router 140 to inject more current into the non-contact areas of the SSL device 100. This causes the non-contact areas to have higher current densities than conventional devices. The SSL device 100, therefore, has a high extraction efficiency because more light is generated from the non-contact areas where the light can be readily extracted without being blocked by the contact fingers 121 and the cross member 123.

Figure 3A:
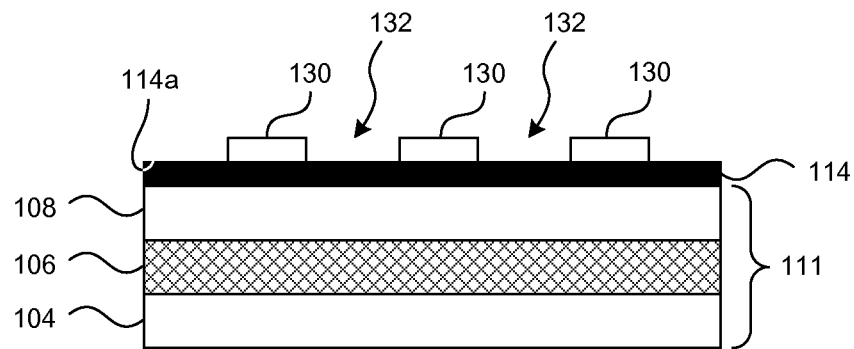
FIGS. 3A-3C illustrate a process of forming the SSL device in FIG. 2A.
Figure 3B:
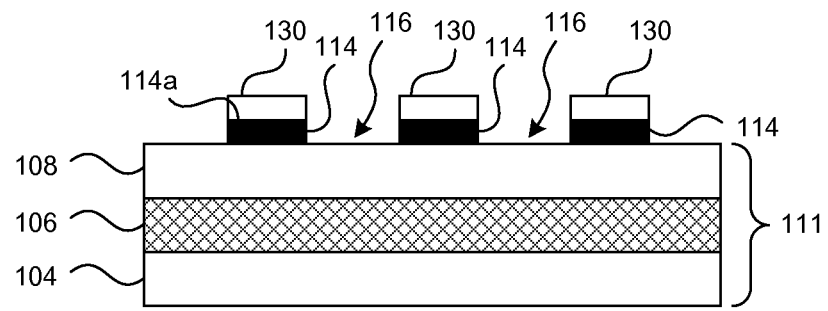
Figure 3C:
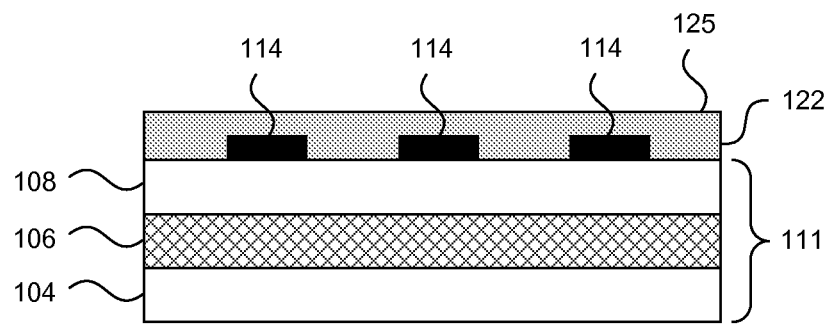

FIGS. 3A-3C illustrate a process of forming the SSL device 100 in FIG. 2A. As shown in FIG. 3A, an initial stage of the process can include forming an SSL structure 111 with the first semiconductor material 104, the active region 106, and the second semiconductor material 108. Another stage of the process can include depositing the insulative material 114 onto the second semiconductor material 108. Techniques for depositing the insulative material 114 can include chemical vapor deposition ("CVD"), atomic layer deposition ("ALD"), spin coating, and/or other suitable deposition techniques.

A masking material 130 (e.g., a photoresist) can be formed on the surface 114a of the insulative material 114. The masking material 130 can then be patterned (e.g., via photolithography) to form one or more openings 132. The openings 132 individually expose a portion of the surface 114a of the insulative material 114.

FIG. 3B shows another stage of the process in which a portion of the insulative material 114 is removed to form apertures 116. Techniques for removing the insulative material 114 can include dry etching, wet etching, laser ablation, and/or other suitable material removal techniques. After forming the apertures 116, the masking material 130 can be removed via wet etching and/or other suitable techniques.

As shown in FIG. 3C, the process can then include depositing the conductive material 125 in the apertures 116 and on the surface 114a of the insulative material 114. Techniques for depositing the conductive material 125 can include CVD, ALD, spin coating, and/or other suitable deposition techniques. The process can then include forming the second contact 122 and/or other suitable components to yield the SSL device 100 as shown in FIG. 2A.

Figure 4A:
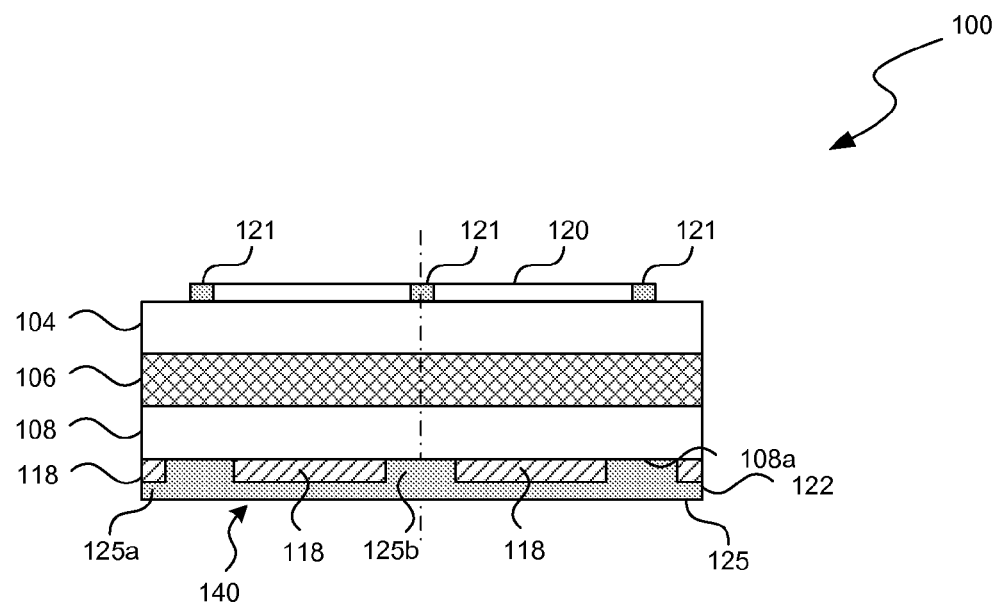
FIGS. 4A and 4B are schematic cross-sectional views of an SSL device in accordance with additional embodiments of the technology.

Even though the current router 140 is discussed above with reference to FIGS. 2A and 2B as having the insulative material 114, in other embodiments, the current router 140 can also include a conductive material, a semiconductive material, and/or a combination thereof. For example, FIG. 4A is a schematic cross-sectional view of an SSL device 100 having a conductive current router 140. As shown in FIG. 4A, the second contact 122 can include a plurality of pads of contact material 118 and the conductive material 125. The conductive material 125 is formed around the contact material 118 such that the contact material 118 forms a conductive current router 140. The first portion 125a of the conductive material 125 is generally continuous, and the second portion 125b is between adjacent pads of the contact material 118. As discussed above with reference to FIG. 2A, the first and second portions 125a and 125b may contain generally similar or different materials.

Figure 4B:
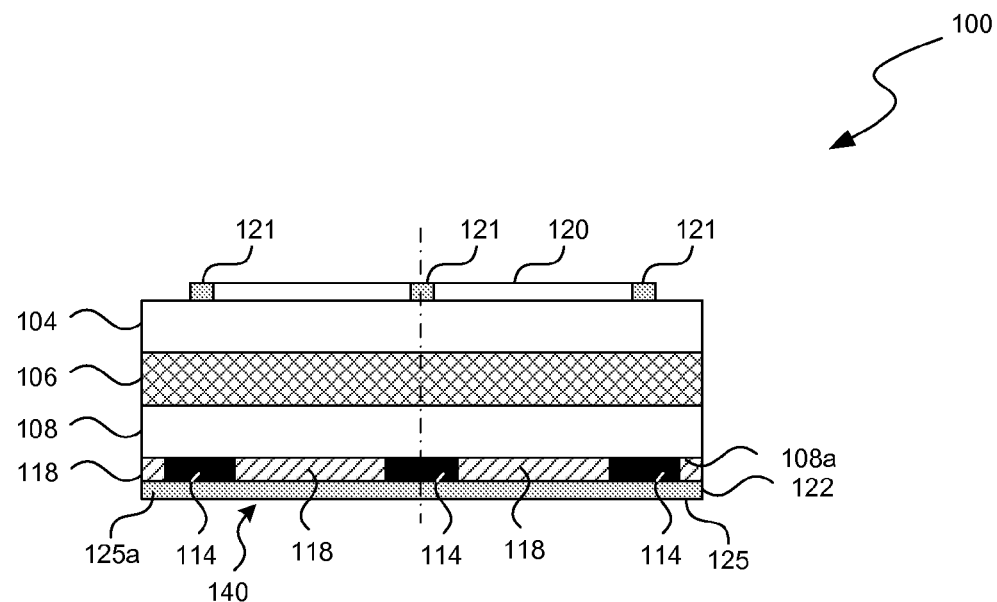

The contact material 118 can have a lower contact resistance than the conductive material 125 when formed on the second semiconductor material 108. As used herein, the term "contact resistance" generally refers to an electrical resistance as a result of two materials in direct contact with each other and forming an interface therebetween. For example, in one embodiment, the conductive material 125 includes at least one of indium tin oxide ("ITO"), aluminum zinc oxide ("AZO"), fluorine-doped tin oxide ("FTO"), and/or other suitable transparent conductive oxides ("TCOs"), and the contact material 118 can include copper (Cu), aluminum (Al), silver (Ag), gold (Au), platinum (Pt), and/or other suitable metals. Without being bound by theory, it is believed that TCOs tend to have higher contact resistance when formed on a semiconductor material than metals. In another embodiment, the conductive material 125 can include aluminum (Al), and the contact material 118 can include silver (Ag) or gold (Au). In further embodiments, the contact material 118 can form a generally Ohmic contact with the second semiconductor material 108 while the conductive material 125 forms a Schottky contact and/or other suitable types of at least partially resistive contact with the second semiconductor material 108. In yet further embodiments, the conductive material 125 and the contact material 118 can include other suitable compositions. In another example, as shown in FIG. 4B, the second contact 122 can include both the contact material 118 generally offset from the contact areas and the insulative material 114 generally aligned with the contact areas. In any of the foregoing embodiments, the contact material 118 and/or the insulative material 114 can be formed following generally similar processing stages as discussed above with reference to FIGS. 3A-3C.

Similar to the embodiments discussed above with reference to FIGS. 2A-3C, the contact material 118 and/or the insulative material 114 in the SSL device 100 can also influence the current flow profile in the SSL device 100. For example, by decreasing the contact resistance formed between the contact material 118 and the second semiconductor material 108 in regions aligned with the non-contact areas and/or increasing the contact resistance formed between the insulative material 114 and the second semiconductor material 108 in regions aligned with the contact areas of the SSL device 100, the amount of current injected into the non-contact areas can be increased compared to conventional devices. Thus, more current tends to flow through the non-contact areas than in conventional devices. As a result, the light extraction efficiency of the SSL device 100 may be increased.

Figure 5A:
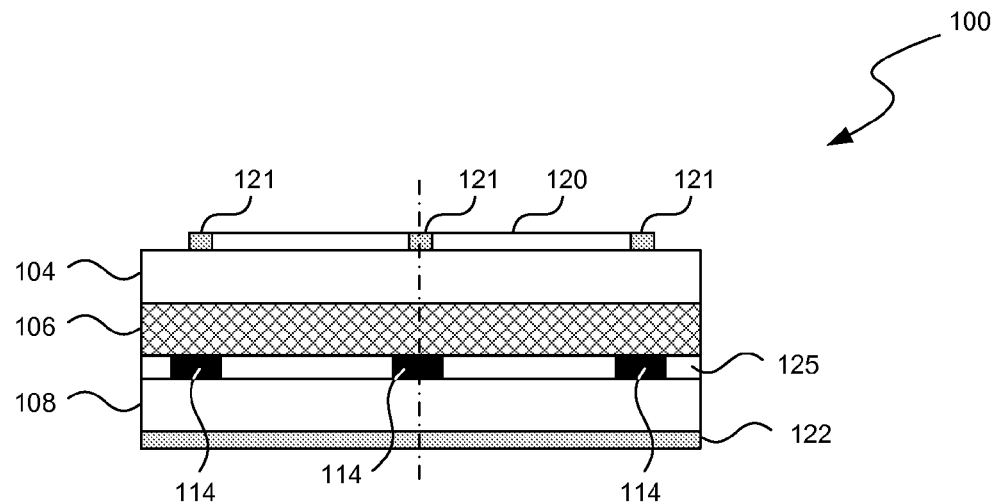
FIGS. 5A-5E are schematic cross-sectional views of an SSL device with current routing in accordance with additional embodiments of the technology.
Figure 5B:
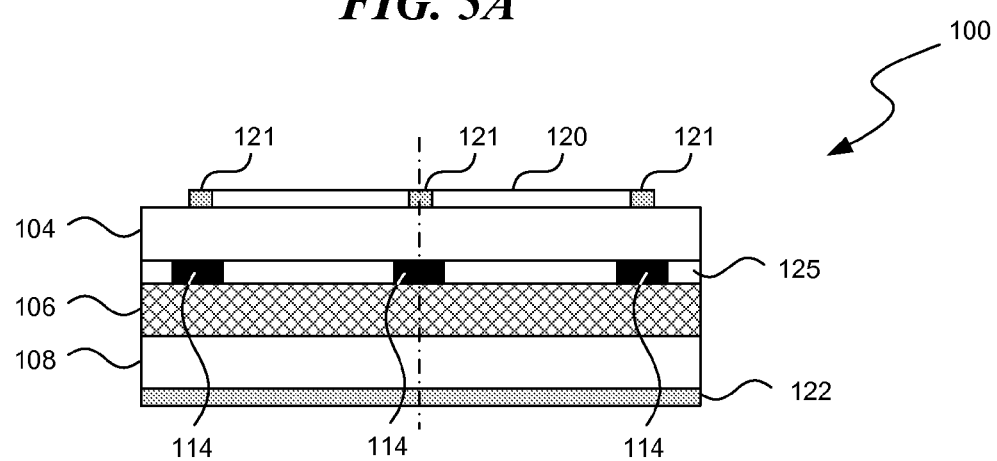
Figure 5C:
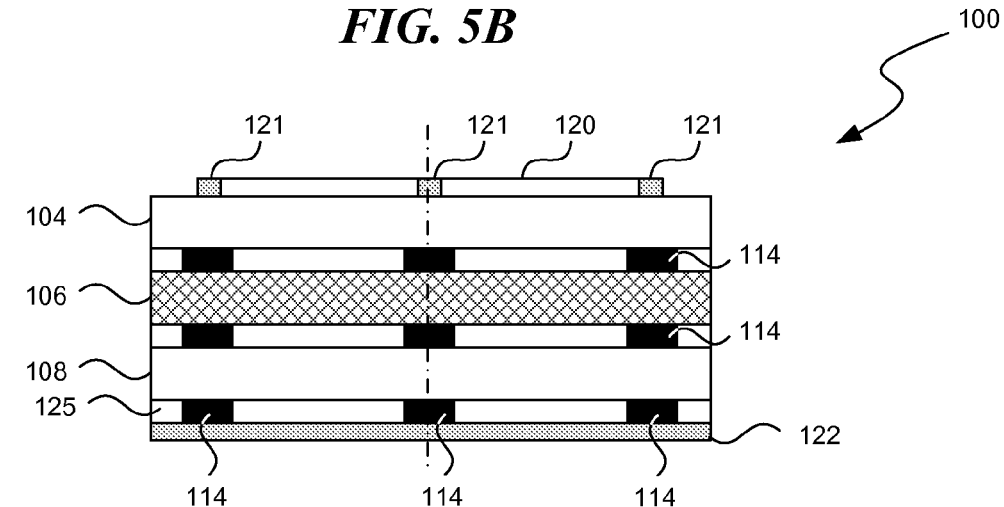
Figure 5D:
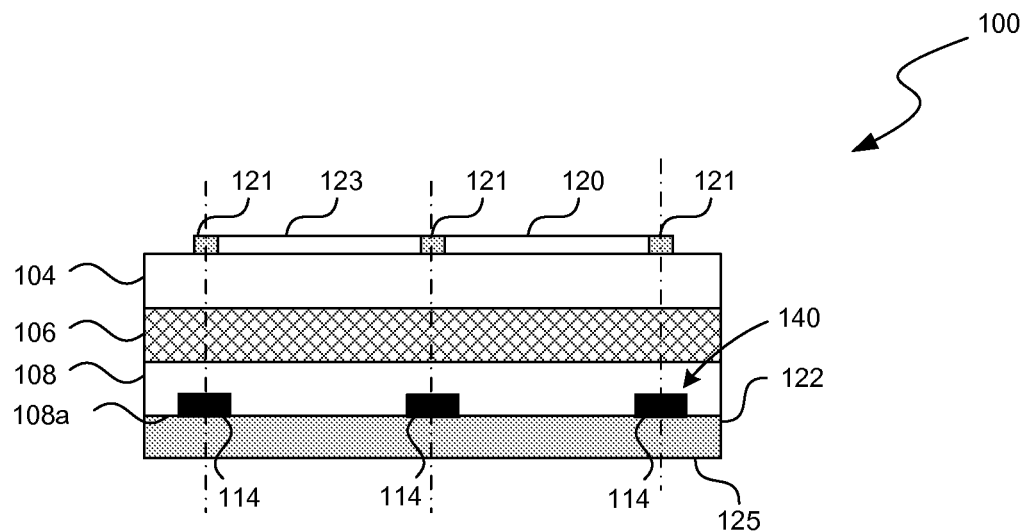
Figure 5E:
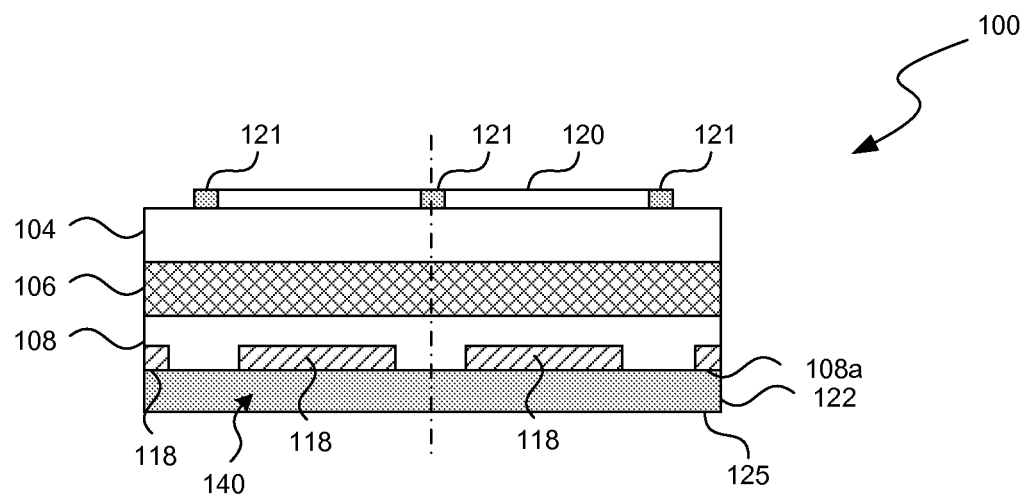

The pads of the insulative material 114 and/or the contact material 118 shown in FIGS. 2A-4B are located between the second semiconductor material 108 and the continuous first portion 125a of the conductive material 125. In other embodiments, the insulative material 114 and/or the contact material 118 can also have other arrangements. For example, as shown in FIG. 5A, the insulative material 114 can be between the active region 106 and the second semiconductor material 108. In another example, as shown in FIG. 5B, the insulative material 114 can be between the active region 106 and the first semiconductor material 104. In further examples, as shown in FIG. 5C, the SSL device 100 may have the insulative material 114 in more than one location. In further embodiments, the insulative material 114 and/or the contact material 118 may be embedded in the second semiconductor material 108, as shown in FIGS. 5D and 5E. As a result, the surface 108a of the second semiconductor material 108 may be generally planar.

Even though the insulative material 114 and/or the contact material 118 are discussed above as generally homogenous structures, in certain embodiments, the insulative material 114 and/or the contact material 118 can also include a plurality of insulative and/or conductive portions (not shown) with different values of electrical resistance, as discussed in more detail in U.S. patent application Ser. No. 12/872,092, entitled "SOLID STATE LIGHTING DEVICES WITH IMPROVED CONTACTS AND ASSOCIATED METHODS OF MANUFACTURING," filed Aug. 31, 2010, and published as U.S. Application Publication No. 2012/0049756, the disclosure of which is incorporated herein in its entirety.

From the foregoing, it will be appreciated that specific embodiments of the technology have been described herein for purposes of illustration, but that various modifications may be made without deviating from the disclosure. In addition, many of the elements of one embodiment may be combined with other embodiments in addition to or in lieu of the elements of the other embodiments. Accordingly, the disclosure is not limited except as by the appended claims.

I claim:

1. A solid state lighting (SSL) device, comprising:
a first semiconductor material;
a second semiconductor material spaced apart from the first semiconductor material;
an active region between the first and second semiconductor materials;
a first contact on the first semiconductor material;
a second contact on the second semiconductor material, the second contact being opposite the first contact;
a first insulative material between the first contact and the first semiconductor material, the first insulative material being aligned with the second contact; and
a second insulative material between at least one of the first semiconductor material and the active region and/or the second semiconductor material and the active region, wherein the second insulative material is aligned with the first insulative material and separated from the first insulative material by at least the first semiconductor material.

2. The SSL device of claim 1 wherein:
the second contact includes a contact finger with a first width;
the first semiconductor material includes a P-type gallium nitride (GaN) material;
the second semiconductor material includes an N-type GaN material;
the active region includes at least one of a bulk indium gallium nitride (InGaN) material, an InGaN single quantum well ("SQW"), and GaN/InGaN multiple quantum wells ("MQWs");
the first contact includes a conductive material having an aperture extending from the first semiconductor material into the conductive material;
the conductive material includes aluminum (Al);
the aperture has a shape similar to that of the contact finger of the second contact;
the aperture contains the first insulative material;

the first insulative material includes silicon dioxide (SiO2); and the aperture has a second width larger than the first width.

3. The SSL device of claim 1 wherein:
the second contact includes a contact finger with a first width;
the first semiconductor material includes a P-type gallium nitride (GaN) material;
the second semiconductor material includes an N-type GaN material;
the active region includes at least one of a bulk indium gallium nitride (InGaN) material, an InGaN single quantum well ("SQW"), and GaN/InGaN multiple quantum wells ("MQWs");
the first contact includes a conductive material having an aperture extending from the first semiconductor material into the conductive material;
the aperture has a shape similar to that of the contact finger of the second contact;
the aperture contains the first insulative material; and
the aperture has a second width generally equal to the first width.

4. The SSL device of claim 1 wherein:
the second contact includes a contact finger with a first width;
the first semiconductor material includes a P-type gallium nitride (GaN) material;
the second semiconductor material includes an N-type GaN material;
the active region includes at least one of a bulk indium gallium nitride (InGaN) material, an InGaN single quantum well ("SQW"), and GaN/InGaN multiple quantum wells ("MQWs");
the first contact includes a conductive material having an aperture extending from the first semiconductor material into the conductive material;
the aperture has a shape similar to that of the contact finger of the second contact;
the aperture contains the first insulative material; and
the aperture has a second width greater than the first width.

5. The SSL device of claim 1 wherein:
the second contact includes a contact finger with a first width;
the first semiconductor material includes a P-type gallium nitride (GaN) material;
the second semiconductor material includes an N-type GaN material;
the active region includes at least one of a bulk indium gallium nitride (InGaN) material, an InGaN single quantum well ("SQW"), and GaN/InGaN multiple quantum wells ("MQWs");
the first contact includes a conductive material having an aperture extending from the first semiconductor material into the conductive material;
the aperture has a shape similar to that of the contact finger of the second contact;
the aperture contains the first insulative material; and
the aperture has a second width smaller than the first width.

6. The SSL device of claim 1 wherein:
the first contact includes a conductive material having an aperture extending from the first semiconductor material into the conductive material; and
the aperture contains the first insulative material.

7. The SSL device of claim 1 wherein:
the first contact includes a conductive material having an aperture extending from the first semiconductor material into the conductive material;

the aperture has a shape similar to that of the second contact; and
the aperture contains the first insulative material.

8. The SSL device of claim 1 wherein:
the second contact includes a contact finger;
the first contact includes a conductive material having an aperture extending from the first semiconductor material into the conductive material;
the aperture has a shape similar to that of the contact finger of the second contact; and
the aperture contains the first insulative material.

9. A solid state lighting (SSL) device, comprising:
a first semiconductor material;
a second semiconductor material spaced apart from the first semiconductor material;
an active region between the first and second semiconductor materials;
a first contact on the first semiconductor material;
a second contact on the second semiconductor material, the second contact being opposite the first contact;
a current router between the first contact and the first semiconductor material, the current router being configured to decrease a first current flow in a first area superimposed with the second contact and increase a second current flow in a second area generally offset from the second contact;
a first insulative material between the first semiconductor material and the first contact, the first insulative material being aligned with the second contact; and
a second insulative material between at least one of the first semiconductor material and the active region and/or the second semiconductor material and the active region, wherein the second insulative material is aligned with the first insulative material and separated from the first insulative material by at least the first semiconductor material.

10. The SSL device of claim 9 wherein the current router includes a conductive material between the first semiconductor material and the first contact, the conductive material being offset from the second contact.

11. The SSL device of claim 9 wherein the current router includes a conductive material and a first insulative material between the first semiconductor material and the first contact, the conductive material being offset from the second contact, and the first insulative material being aligned with the second contact.

12. A method of forming a solid state lighting (SSL) device, comprising:
forming an SSL structure having a first semiconductor material, a second semiconductor material spaced apart from the first semiconductor material, and an active region between the first and second semiconductor materials;
forming a first contact on the first semiconductor material;
forming a first insulative material between at least one of the first semiconductor material and the active region and/or the second semiconductor material and the active region,
forming a current router on the second semiconductor material, the current router being aligned with the first contact and including a second insulative material aligned with the first insulative material and separated from the first insulative material by at least the first semiconductor material; and
forming a second contact on the second semiconductor material and on the current router.

13. The method of claim 12 wherein forming the second contact includes encapsulating the current router with a conductive material.

14. The method of claim 12 wherein:
    forming the second contact includes encapsulating the second insulative material with a conductive material; and
    the conductive material includes a first portion and a second portion, the first portion being separated from the second semiconductor material by the second insulative material, the second portion being in contact with the second semiconductor material.

15. The method of claim 12 wherein:
    forming the current router includes:
        blanketing the second semiconductor material with the second insulative material;
        depositing a masking material onto the second insulative material;
        patterning the masking material to define an opening;
        removing a portion of the second insulative material to form the aperture; and
    forming the second contact includes encapsulating the second insulative material with a conductive material, the conductive material including a first portion and a second portion, the first portion being on the second insulative material, and the second portion being in the aperture.

16. The method of claim 12 wherein:
    forming the current router includes:
        blanketing the second semiconductor material with a contact material;
        depositing a masking material onto the blanketing contact material;
        patterning the masking material to define an opening;
        removing a portion of the contact material to form the aperture, the aperture being offset from the first contact; and
    forming the second contact includes encapsulating the contact material with a conductive material, the conductive material including a first portion and a second portion, the first portion being on the contact material, and the second portion being in the aperture, wherein the contact material has contact resistance lower than that of the conductive material.

* * * * *